(12) United States Patent
Nagao et al.

(10) Patent No.: US 8,964,389 B2
(45) Date of Patent: Feb. 24, 2015

(54) ELECTRONIC COMPONENT COOLING UNIT AND POWER CONVERTING DEVICE

(75) Inventors: Toshio Nagao, Kitakyushu (JP); Tetsuya Ito, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 308 days.

(21) Appl. No.: 13/600,151

(22) Filed: Aug. 30, 2012

(65) Prior Publication Data

US 2013/0051108 A1 Feb. 28, 2013

(30) Foreign Application Priority Data

Aug. 31, 2011 (JP) ................. 2011-188524

(51) Int. Cl.
*H05K 7/20* (2006.01)
*F28F 7/00* (2006.01)
*H01L 23/473* (2006.01)

(52) U.S. Cl.
CPC .......... *H01L 23/473* (2013.01); *H05K 7/20927* (2013.01); *H01L 2924/0002* (2013.01)
USPC .......................... 361/699; 165/80.4

(58) Field of Classification Search
None
See application file for complete search history.

(56) References Cited

U.S. PATENT DOCUMENTS

| | | | |
|---|---|---|---|
| 6,966,359 B1 * | 11/2005 | Liu | 165/104.21 |
| 8,182,661 B2 * | 5/2012 | Tanase et al. | 204/298.09 |
| 2005/0141196 A1 * | 6/2005 | Yamatani et al. | 361/699 |
| 2005/0217823 A1 | 10/2005 | Osanai | |
| 2006/0207780 A1 | 9/2006 | Shinmura et al. | |
| 2008/0137300 A1 * | 6/2008 | Macris et al. | 361/699 |
| 2010/0232110 A1 * | 9/2010 | Ippoushi et al. | 361/699 |
| 2010/0238629 A1 * | 9/2010 | Shiba | 361/699 |

FOREIGN PATENT DOCUMENTS

| | | |
|---|---|---|
| JP | 53-020772 | 2/1978 |
| JP | 56-034345 U | 4/1981 |
| JP | 2006-261368 | 9/2006 |
| JP | 2010-006204 | 1/2010 |
| JP | 2010-103582 | 5/2010 |

OTHER PUBLICATIONS

Japanese Office Action for corresponding JP Application No. 2011-188524, Aug. 9, 2013.

* cited by examiner

*Primary Examiner* — Gregory Thompson
(74) *Attorney, Agent, or Firm* — Mori & Ward, LLP

(57) ABSTRACT

An electronic component cooling unit includes a housing having a flow path in an interior of the cooling unit. The flow path circulates a cooling medium. Two surfaces, that is, a top surface and a bottom surface, are located at the housing. Electronic components are mounted to the housing, and side surfaces are located at the housing and surround the top surface and the bottom surface. Multiple opening portions are located at the side surfaces and communicate with the flow path. A closing member closes the opening portion or each opening portion other than the opening portions that corresponds to a supply opening and a discharge opening for the cooling medium.

16 Claims, 6 Drawing Sheets

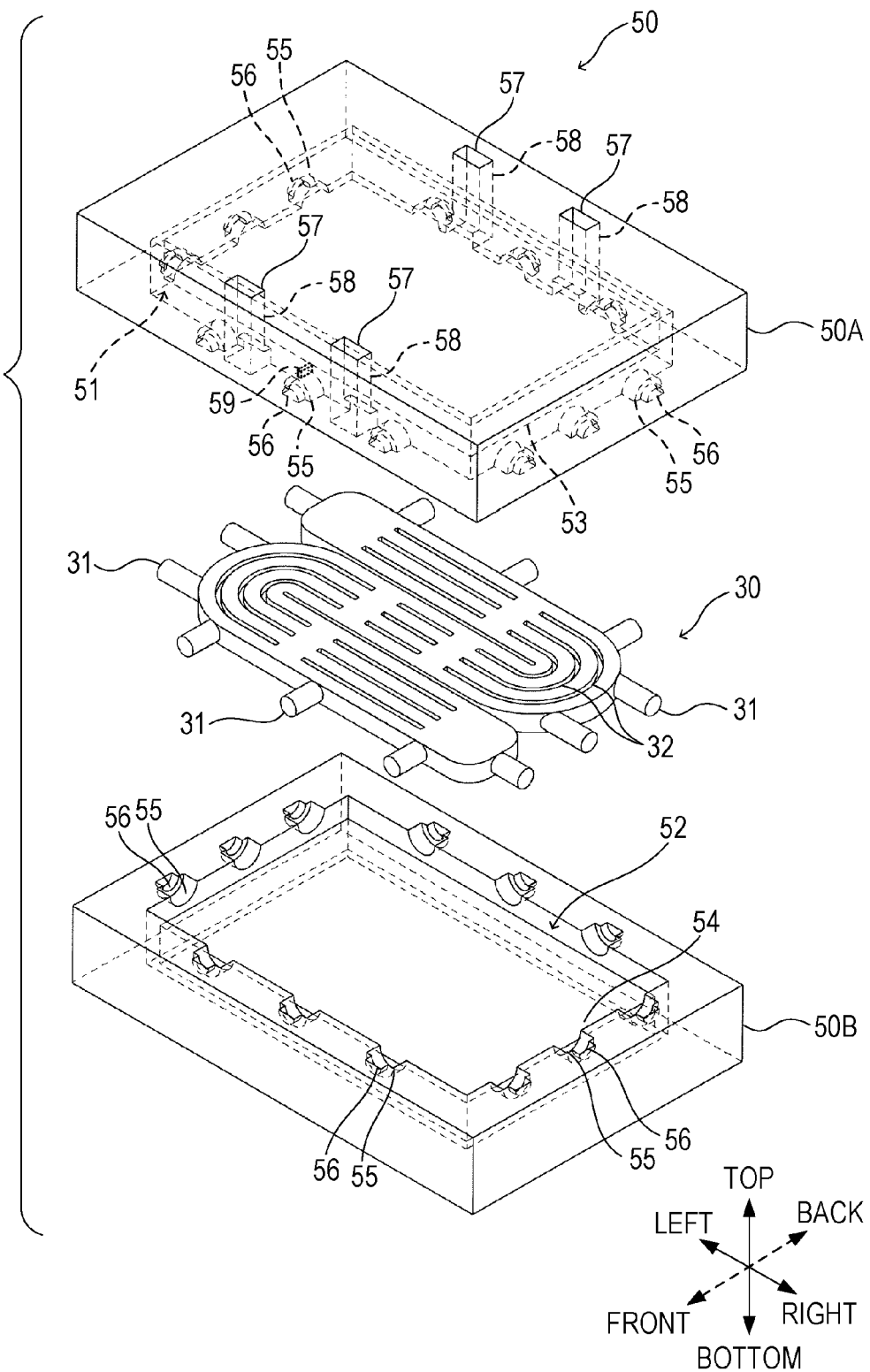

ELECTRONIC COMPONENT COOLING UNIT AND POWER CONVERTING DEVICE

CROSS REFERENCES TO RELATED APPLICATIONS

The present disclosure contains subject matter related to that disclosed in Japanese Priority Patent Application JP 2011-188524 filed in the Japan Patent Office on Aug. 31, 2011, the entire contents of which are hereby incorporated by reference.

BACKGROUND OF THE INVENTION

1. Field of the Invention

Embodiments of the disclosure relate to electronic component cooling units and power converting devices.

2. Description of the Related Art

Japanese Unexamined Patent Application Publication No. 2006-261368 (Patent Document 1) discusses a structure for sealing accommodation chambers that accommodate electronic components and a cooling path that is formed in a structural member for cooling the electronic components. In the electronic component cooling unit (electronic component accommodating structural member), a first housing and a second housing, each having an accommodation chamber that accommodates an electronic component, are connected to each other at a joint surface. At the joint surface, a flow-path area and a communicating-path area are formed. The cooling path through which a cooling liquid flows extends through the flow-path area. A communicating path that causes the accommodation chambers of the first and second housings to communicate with each other extends through the communicating-path area. In addition, at the joint surface, an integrally formed seal member that independently surrounds the flow-path area and the communicating-path area and that seals the areas is disposed.

Although not expressly mentioned in Patent Document 1, in general, an electronic component cooling unit is provided with a supply opening and a discharge opening for circulating a cooling medium in the cooling path. A cooling-medium supply pipe is connected to the supply opening and a cooling-medium discharge pipe is connected to the discharge opening. Individual needs regarding the dispositions of the supply opening and the discharge opening differ depending upon, for example, setting conditions and use environment of the electronic component cooling unit.

However, in the structure of the related art, the first and second housings are generally manufactured by die casting in which a molten metal is press-fitted to a die. Therefore, in order to change the dispositions of the supply opening and the discharge opening in accordance with individual needs, the die is changed. Consequently, costs are high and manufacturing time is long, as a result of which it is not possible to easily change the dispositions of the cooling-medium supply opening and the cooling-medium discharge opening.

SUMMARY OF THE INVENTION

According to an aspect of the present disclosure, there is provided an electronic component cooling unit including a housing having a flow path in an interior thereof, the flow path being configured to circulate a cooling medium; at least one first surface provided at the housing, an electronic component being mounted to the at least one first surface; a second surface provided at the housing, the second surface surrounding a periphery of the at least one first surface; a plurality of opening portions provided at the second surface, the plurality of opening portions communicating with the flow path; and a closing member configured to close, among the plurality of opening portions, the opening portion or each opening portion other than the opening portions corresponding to a supply opening and a discharge opening for the cooling medium.

According to another aspect of the present disclosure, there is provided a power converting device that converts alternating-current power into direct-current power or that converts direct-current power into alternating-current power. The power converting device includes a housing having a flow path in an interior thereof, the flow path being configured to circulate a cooling medium; an electronic component mounted to at least one first surface provided at the housing; a second surface provided at the housing, the second surface surrounding a periphery of the at least one first surface; a plurality of opening portions provided at the second surface, the plurality of opening portions communicating with the flow path; and a closing member configured to close, among the plurality of opening portions, the opening portion or each opening portion other than the opening portions corresponding to a supply opening and a discharge opening for the cooling medium.

BRIEF DESCRIPTION OF THE DRAWINGS

FIG. 9 is a perspective view of a structure of a master mold and a core used in manufacturing a housing of the third power converting device.

DESCRIPTION OF THE PREFERRED EMBODIMENTS

Embodiments will hereunder be described with reference to the drawings. The embodiments will be described taking as an example a case in which an electronic component cooling unit is applied to a power converting device that converts alternating-current power into direct-current power or that converts direct-current power into alternating-current power.

First Power Converting Device (when a Supply Opening and a Discharge Opening are Both Disposed at a Front Side)

Figure 1:
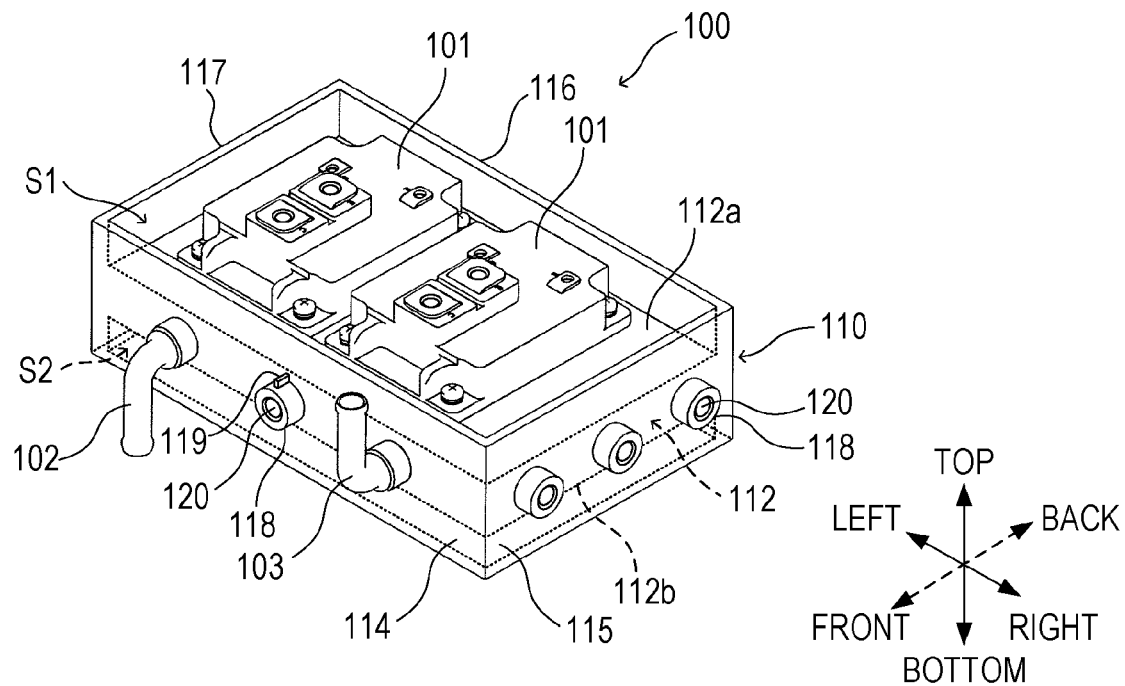
FIG. 1 is a perspective view of an overall structure of a first power converting device having a cooling-medium supply opening and a cooling-medium discharge opening at a front side thereof.

An overall structure of a first power converting device 100 will be described with reference to FIGS. 1 and 2. For the sake of explanatory convenience, directions will be defined as follows. That is, a lower left direction in FIG. 1 (downward direction in FIG. 2) is defined as "front." An upper right direction in FIG. 1 (an upward direction in FIG. 2) is defined as "back." An upper left direction in FIG. 1 (a leftward direction in FIG. 2) is defined as "left." A lower right direction in FIG. 1 (a rightward direction in FIG. 2) is defined as "right." An upward direction in FIG. 1 (a direction towards a near side in the plane of FIG. 2) is defined as "top." A downward direction in FIG. 1 (a direction towards a far side in the plane of FIG. 2) is defined as "bottom."

The first power converting device 100 has a cooling-medium supply opening and a cooling-medium discharge opening, both of which are provided at a front side of the device 100. As shown in FIGS. 1 and 2, the first power converting device 100 includes a substantially rectangular parallelepiped housing 110 having two accommodation chambers S1 and S2 for accommodating electronic components. The housing 10 is integrally formed by a casting method such as a die casting method. In the housing 110, the accommodation chamber S1 and the accommodation chamber S2 are separated by a separation wall 112. A flow path 111 along which a cooling medium circulates is formed by a core 10 (described later) in an inner portion of the separation wall 112. Electronic components are mounted to a top surface 112a and a bottom surface 112b of the separation wall 112. In the embodiment, two power modules 101, including a plurality of switching elements formed using semiconductor elements (such as insulated gate bipolar transistors (IGBTs)), are mounted to the top surface 112a. By repeating conduction and current interruption in an appropriate order using the plurality of switching elements, the power modules 101 convert direct-current power into alternating-current power having a predetermined frequency, and outputs the alternating-current power having the predetermined frequency. Other electronic components (such as power supply substrates or control substrates) (not shown) are mounted to the bottom surface 112b.

In the embodiment, although the housing 110 includes two accommodation chambers, the housing 110 may include one accommodation chamber. In addition, although two power modules 101 are mounted, the number of power modules is not limited thereto, so that one or three or more power modules 101 may be mounted. The top surface 112a and the bottom surface 112b of the separation wall 112 each correspond to an exemplary first surface in the claims.

The housing 110 has side surfaces 114 to 117 that surround a periphery of the top surface 112a and a periphery of the bottom surface 112b of the separation wall 112. The side surfaces 114 to 117 form a front side surface, a right side surface, a back side surface, and a left side surface of the housing 110. The side surfaces 114 to 117 each correspond to an exemplary second surface in the claims. The side surfaces 114 to 117 are provided with a plurality of opening portions 118 that communicate with the flow path 111. In the embodiment, each of the side surfaces 114 to 117 is provided with three opening portions 118. The three opening portions 118 are disposed at a center portion and on both sides of the center portion of each of the side surfaces 114 to 117. The opening portions 118 protrude from the side surfaces 114 to 117.

In the first power converting device 100, among the plurality of opening portions 118, the opening portion 118 provided on the left side of the front side surface 114 corresponds to the cooling-medium supply opening to which a supply pipe 102 is connected. Among the plurality of opening portions 118, the opening portion 118 provided on the right side of the front side surface 114 corresponds to the cooling-medium discharge opening to which a discharge pipe 103 is connected. In the embodiment, by press-fitting a press-fitting portion 102a of the supply pipe 102 and a press-fitting portion 103a of the discharge pipe 103 to the corresponding opening portions 118, the supply pipe 102 and the discharge pipe 103 are secured to their corresponding opening portions 118. The opening portions 118 other than the opening portions 118 corresponding to the supply opening and the discharge opening are each provided with a closing member that closes the corresponding opening portion 118. In the embodiment, the blocking members 120 are press-fitted and secured to the corresponding opening portions 118.

The method of securing the supply pipe 102, the discharge pipe 103, and the closing members 120 to the corresponding opening portions 118 is not limited to the press-fitting method. For example, the opening portions 118 may be internally threaded, and the press-fitting portion 102a of the supply pipe 102, the press-fitting portion 103a of the discharge pipe 103, and the blocking members 120 may be externally threaded, to connect them to each other by screwing.

A protrusion 119 is provided on an upper side of the opening portion 118 provided at the central portion of the front side surface 114 among the plurality of opening portions 118. The protrusion 119 functions as an identifying portion for identifying the opening portions 118 corresponding to the supply opening and the discharge opening. In the embodiment, the side surface 114 at which the protrusion 119 is provided at the front side. The protruding direction of the protrusion 119 is set so as to become an upward direction. Since the forward direction, the backward direction, the leftward direction, the rightward direction, the upward direction, and the downward direction are determined by the protrusion 119, the opening portions 118 corresponding to the supply opening and the discharge opening are identified from their relative positions from the opening portion 118 where the protrusion 119 is provided, this opening portion 118 serving as a reference position.

The form of the identifying portion is not limited to the aforementioned protrusion. It may be, for example, a recess. Alternatively, the protruding shape of the opening portion 118 may be changed into, for example, a protruding prismatic shape. The number of identifying portions and the disposition of the identifying portion are not limited to those mentioned above. For example, two types of identifying portions may be provided at the opening portion 118 corresponding to the supply opening and at the opening portion 118 corresponding to the discharge opening.

The flow path 111 is formed in the inner portion of the separation wall 112. As shown in FIG. 2, the flow path 111 is a substantially U-shaped flow path (inverted U-shaped flow path in FIG. 2) in which the opening portions 118 corresponding to the supply opening and the discharge opening are end portions. That is, a cooling medium supplied from the front left supply pipe 102 flows towards the back along the left side in the separation wall 112, flows from left to right along the back of the separation wall 112, flows towards the front along the right of the separation wall 112, and is discharged from the front right discharge pipe 103. In this way, the cooling medium circulates along the entire separation wall 112, so that the electronic components including the power modules 101 mounted to the top surface 112a and the bottom surface 112b, are cooled.

In an inner portion of the flow path 111, a plurality of rectifying plates 113 (four in the embodiment) that rectify the flow of the cooling medium are provided so as to be substantially parallel to each other along the direction of flow. These rectifying plates 113 are capable of rectifying the flow of the cooling medium, and enlarging a heat-dissipating surface in the flow path 111. Therefore, it is possible to increase cooling efficiency. The rectifying plates 113 may be members that connect an upper inner wall and a lower inner wall of the flow path 11 without any gap therebetween. Alternatively, the rectifying plates 113 may be members including an upper plate portion (provided at the upper inner wall) and a lower plate portion (provided at the lower inner wall) that are separated from each other, so that a gap is provided between the upper inner wall and the lower inner wall. The rectifying plates 113 may be divided at a predetermined position in the direction of flow of the cooling medium (such as at a back central portion in the separation wall 112).

Figure 2:
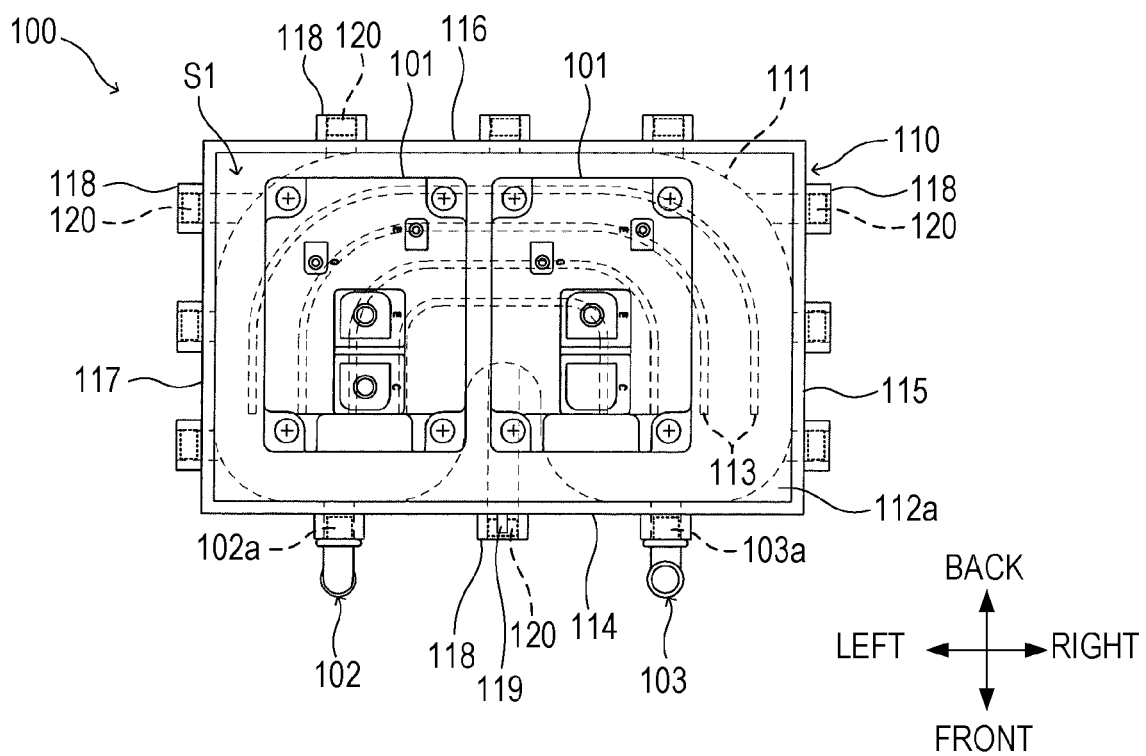
FIG. 2 is a top view of the overall structure of the first power converting device.

In the first power converting device 100, in terms of the structure of the flow path 111, considering, for example, cooling efficiency and pressure loss, it is most desirable to dispose the cooling-medium supply opening and the cooling-medium discharge opening as it is shown in FIG. 2. However, the disposition of these openings is not limited thereto. For example, by changing the disposition of the supply opening to the opening portion 118 provided at the front side of the left side surface 117 or by changing the disposition of the discharge opening to the opening portion 118 provided at the front side of the right side surface 115, it is possible to change the dispositions of the supply opening and the discharge opening within a range allowing, for example, a reduction in cooling efficiency and an increase in pressure loss.

Of the portions of the first power converting device 100 having the above-described structure, the housing 110, the top surface 112a, the bottom surface 112b, the side surfaces 114 to 117, the opening portions 118, and the closing members 120 correspond to an exemplary electronic component cooling unit in the claims.

Figure 3:
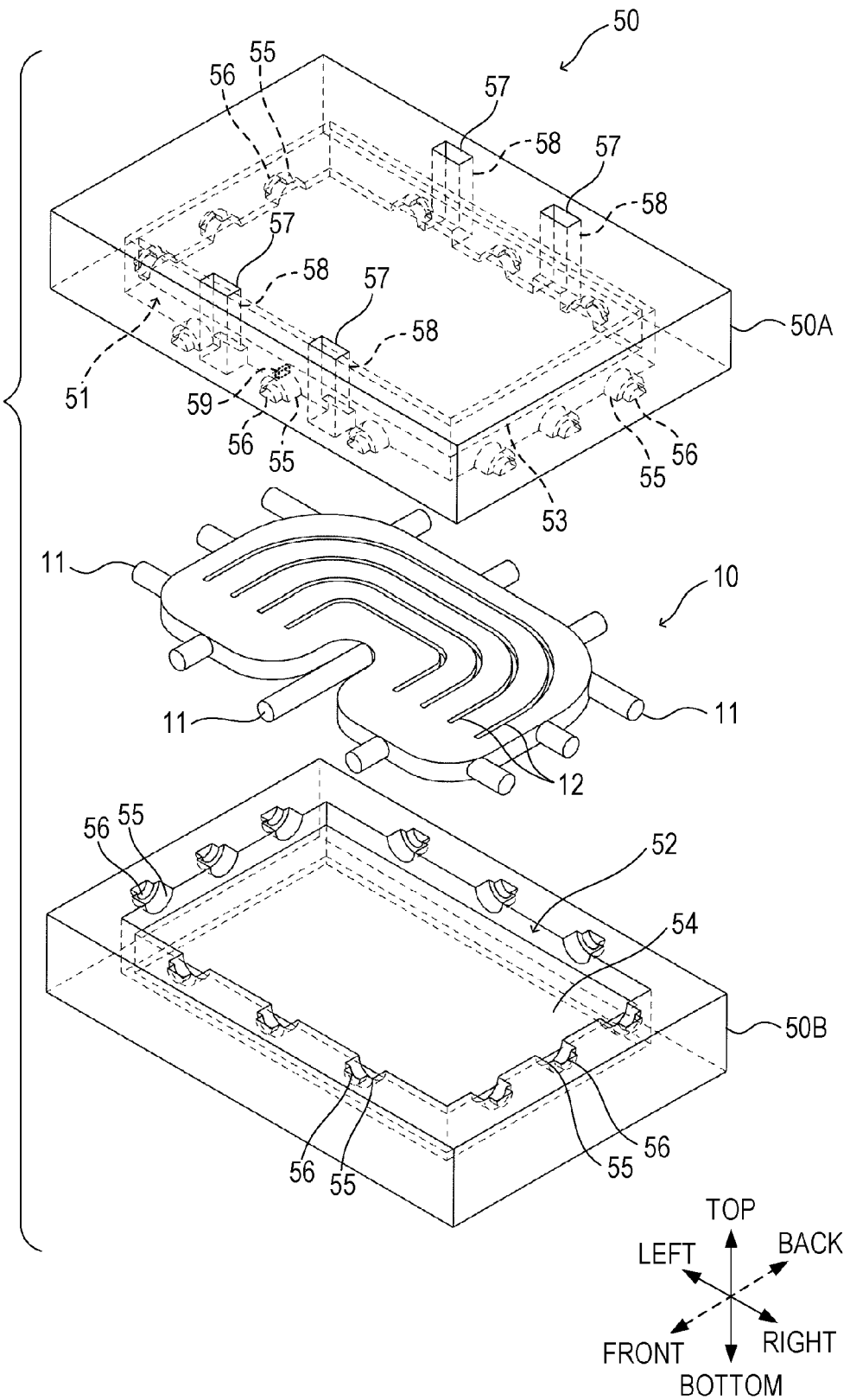
FIG. 3 is a perspective view of a structure of a master mold and a core used in manufacturing a housing of the first power converting device.

Next, using FIG. 3, the structure of a master mold 50 and a core 10 used in manufacturing the housing 110 of the first power converting device 100 will be described. A lower left direction in FIG. 3 is defined as "front." An upper right direction in FIG. 3 is defined as "back." An upper left direction in FIG. 3 is defined as "left." A lower right direction in FIG. 3 is defined as "right." An upward direction in FIG. 3 is defined as "top." A downward direction in FIG. 3 is defined as "bottom." These directions correspond to the directions of the power converting device 100 shown in FIGS. 1 and 2.

The master mold 50 is a mold used when integrally forming the housing 110 by a casting method such as a die casting method, and includes two master mold portions 50A and 50B. The master mold portions 50A and 50B have corresponding recesses 51 and 52 serving as cavities for press-fitting molten metal. A table-like protruding portion 53 for forming the accommodation chamber S1 is provided at the recess 51. A table-like protruding portion 54 for forming the accommodation chamber S2 is provided at the recess 52. Opening-portion recesses 55 are provided in the recesses 51 and 52 so as to be positioned in correspondence with the opening portions 118 of the housing 110. Supporting recesses 56 that are smaller in diameter than the opening-portion recesses 55 are provided at the corresponding opening-portion recesses 55 for supporting the core 10.

A plurality of gates 57 (four in the embodiment) for injecting molten metal are provided in the upper master mold portion 50A. The gates 57 communicate with the recess 51 through passage ways 58. A protrusion recess 59 for forming the protrusion 119 is provided at an upper side of the opening-portion recess 55 at a front center portion of the master mold portion 50A.

The core 10 has a substantially U shape formed in correspondence with the flow path 111. Three cylindrical holding portions 11 each are provided at a front side, a back side, a left side, and a right side of the core 10 so as to protrude therefrom. By fitting the holding portions 11 to the supporting recesses 56 of the master mold portions 50A and 50B, the core 10 is held, thereby not allowing positional displacement of the core 10 during press-fitting of molten metal. Grooves 12 for forming the rectifying plates 113 are formed in the core 10. The shapes of the grooves 12 are changed as appropriate in accordance with the shapes of the rectifying plates 113 to be formed. For example, as mentioned above, when the rectifying plates 113 are members that connect the upper inner wall and the lower inner wall of the flow path 11 without any gap therebetween, the grooves 12 extend through the core 10 in an up-down direction, whereas, when the rectifying plates 113 are members including an upper plate portion (provided at the upper inner wall) and a lower plate portion (provided at the lower inner wall) that are separated from each other, the grooves 12 become recesses provided in the top surface and the bottom surface of the core 10.

The core 10 is a self-collapsing member formed by bonding sand with a predetermined bonding agent. The bonding agent gradually dissolves as the temperature increases due to press-fitting of molten metal, as a result of which the core 10 undergoes self-collapse after the molten metal is hardened. The core 10 that has become sand is capable of being discharged from the opening portions 118 of the formed housing 110. As a result of forming the core 10 by bonding the sand particles, fine recesses and protrusions are formed at all of the inner walls of the flow path 111 of the housing 110. This makes it possible to enlarge a heat-dissipating surface in the flow path 111, so that cooling efficiency can be further increased.

Second Power Converting Device (when a Supply Opening and a Discharge Opening are Disposed at the Front Side and Back Side)

Figure 4:
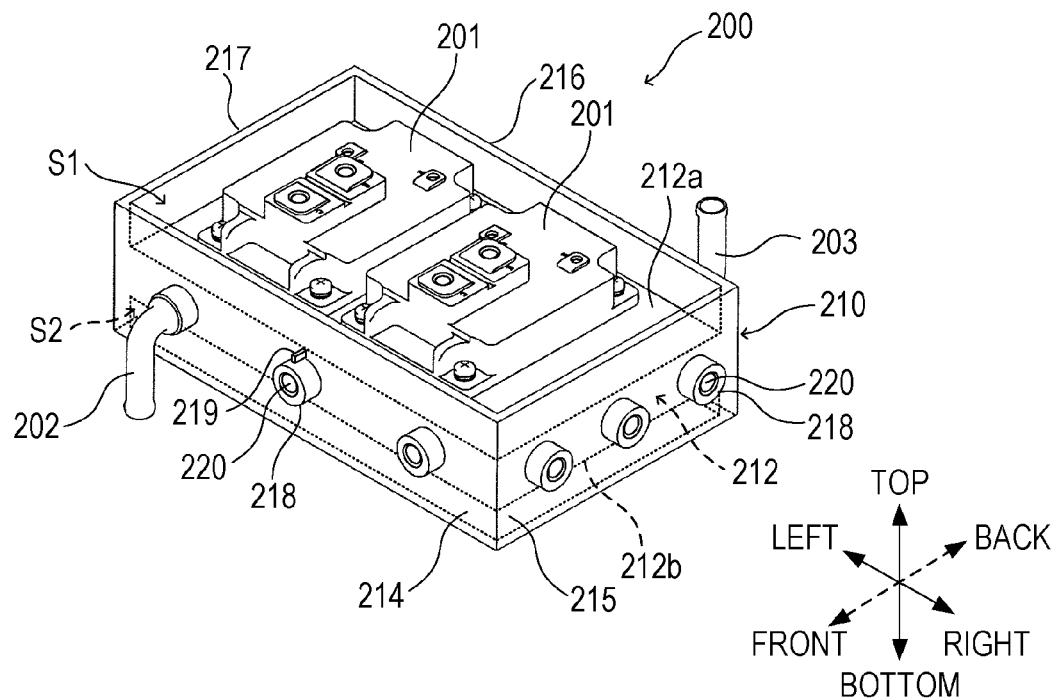
FIG. 4 is a perspective view of an overall structure of a second power converting device having a cooling-medium supply opening and a cooling-medium discharge opening at a front side and a back side thereof.

Next, an overall structure of a second power converting device 200 will be described using FIGS. 4 and 5. Directions in FIGS. 4 and 5 are the same as those in FIGS. 1 and 2, respectively.

The second power converting device 200 is one in which a cooling-medium supply opening and a cooling-medium discharge opening are disposed at the front side and the back side of the device 200. As shown in FIGS. 4 and 5, the second power converting device 200 includes a housing 210. The housing 210 differs from the housing 110 in the position of an opening portion 218 corresponding to a discharge opening and the shape of a flow path 211. That is, in the second power converting device 200, as in the first power converting device 100, among a plurality of opening portions 218, the opening portion 218 provided at the left side of a front side surface 214 corresponds to the cooling-medium supply opening to which a supply pipe 202 is connected. The opening portion 218 provided at the right side of a back side surface 216 corresponds to the cooling-medium discharge opening to which a discharge pipe 203 is connected.

Since the forward direction, the backward direction, the leftward direction, the rightward direction, the upward direction, and the downward direction are determined by a protrusion 219 at the opening portion 218 provided at a central portion of the front side surface 214, the opening portions 218 corresponding to the supply opening and the discharge opening are, as mentioned above, identified from their relative positions from the opening portion 218 where the protrusion 219 is provided, this opening portion serving as a reference position.

Figure 5:
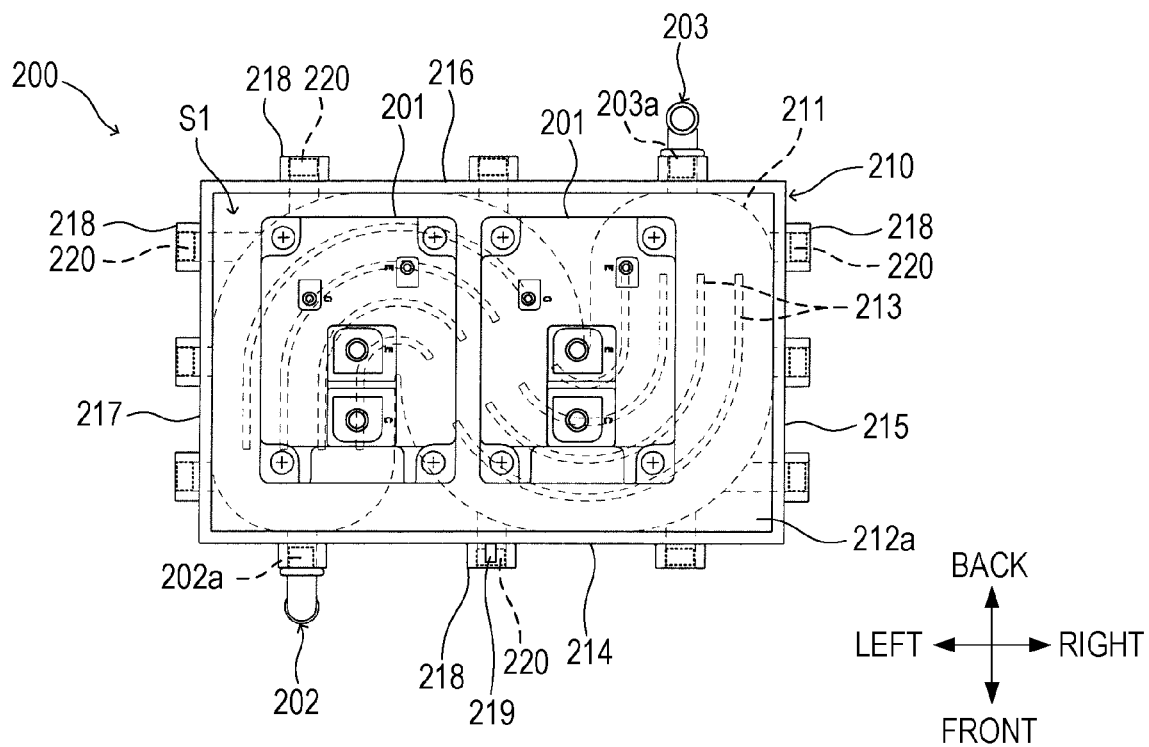
FIG. 5 is a top view of the overall structure of the second power converting device.

As shown in FIG. 5, the flow path 211 is a substantially S-shaped flow path (inverted S-shaped flow path in FIG. 5) in which the opening portions 218 corresponding to the supply opening and the discharge opening are end portions. That is, a cooling medium supplied from the front left supply pipe 202 flows towards the back along the left side in a separation wall 212, turns and flows towards the front along a central portion in a left-right direction, turns again and flows towards the back along the right side, and is discharged from the back right discharge pipe 203. In this way, the cooling medium circulates along the entire separation wall 112, so that electronic components including power modules 201 mounted to a top surface 212a and a bottom surface 212 are cooled.

In an inner portion of the flow path 211, a plurality of rectifying plates 213 (four in the embodiment) are provided so as to be substantially parallel to each other along the direction of flow. In the embodiment, the rectifying plates 213 are divided at substantially central positions (at substantially central portions of the separation wall 212) in the direction of flow of the cooling medium. The number of divisions may be a multiple number of divisions. Alternatively, as with the rectifying plates 113, it is possible for the rectifying plates 113 not to be divided. The other structural features are the same as those of the first power converting device 100, so that they will not be described.

In the second power converting device 200, in terms of the structure of the flow path 211, considering, for example, cooling efficiency and pressure loss, it is most desirable to dispose the cooling-medium supply opening and the cooling-medium discharge opening as it is shown in FIG. 5. However, the disposition of these openings is not limited thereto. For example, by changing the disposition of the supply opening to the opening portion 218 provided at the front side of the left side surface 117 or by changing the disposition of the discharge opening to the opening portion 218 provided at the back side of the right side surface 215, it is possible to change the dispositions of the supply opening and the discharge opening within a range allowing, for example, a reduction in cooling efficiency and an increase in pressure loss.

In the foregoing description, the top surface 212a and the bottom surface 212b of the separation wall 212 each correspond to an exemplary first surface in the claims. The side surfaces 214 to 217 each correspond to an exemplary second surface. Of the portions of the second power converting device 200, the housing 210, the top surface 212a, the bottom surface 212b, the side surfaces 214 to 217, the opening portions 218, and the closing members 220 correspond to an exemplary electronic component cooling unit in the claims.

Figure 6:
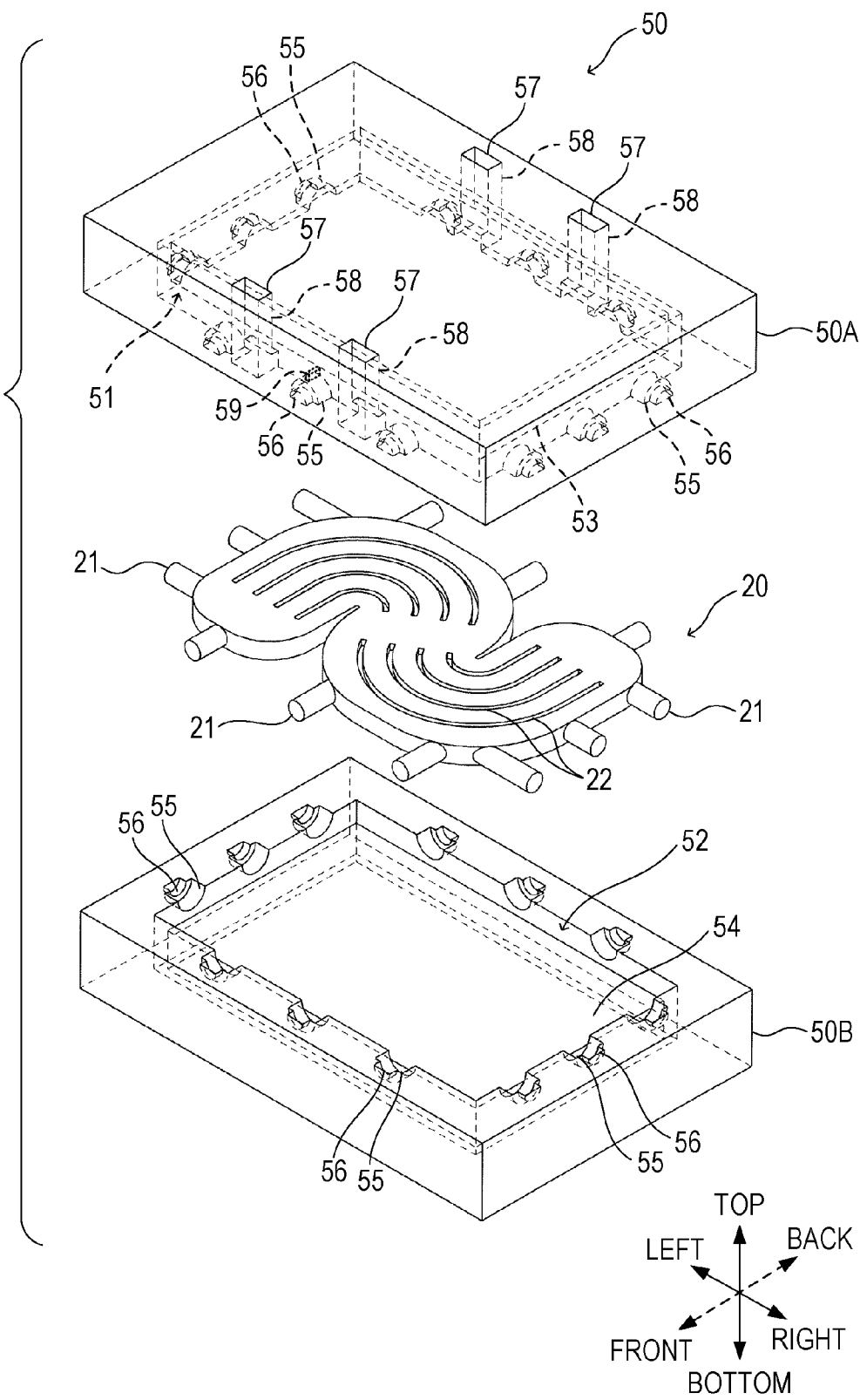
FIG. 6 is a perspective view of a structure of a master mold and a core used in manufacturing a housing of the second power converting device.

Next, using FIG. 6, the structure of a master mold 50 and a core 20 used in manufacturing the housing 210 of the second power converting device 200 will be described. A lower left direction in FIG. 6 is defined as "front." An upper right direction in FIG. 6 is defined as "back." An upper left direction in FIG. 6 is defined as "left." A lower right direction in FIG. 6 is defined as "right." An upward direction in FIG. 6 is defined as "top." A downward direction in FIG. 6 is defined as "bottom." These directions correspond to the directions of the power converting device 200 shown in FIGS. 4 and 5.

The master mold 50 corresponds to that used in manufacturing the housing 110 of the first power converting device 100, so that the master mold 50 will not be described below. The core 20 has a substantially S shape formed in correspondence with the flow path 211. Three cylindrical holding portions 11 each are provided at a front side, a back side, a left side, and a right side of the core 20 so as to protrude therefrom. By fitting the holding portions 21 to supporting recesses 56 of master mold portions 50A and 50B, the core 20 is held, thereby not allowing positional displacement of the core 20 during press-fitting of molten metal. Grooves 22 for forming the rectifying plates 213 are formed in the core 20. The shapes of the grooves 22 are changed as appropriate in accordance with the shapes of the rectifying plates 213 to be formed.

Third Power Converting Device (when a Supply Opening and a Discharge Opening are Disposed at the Left Side and Right Side)

Figure 7:
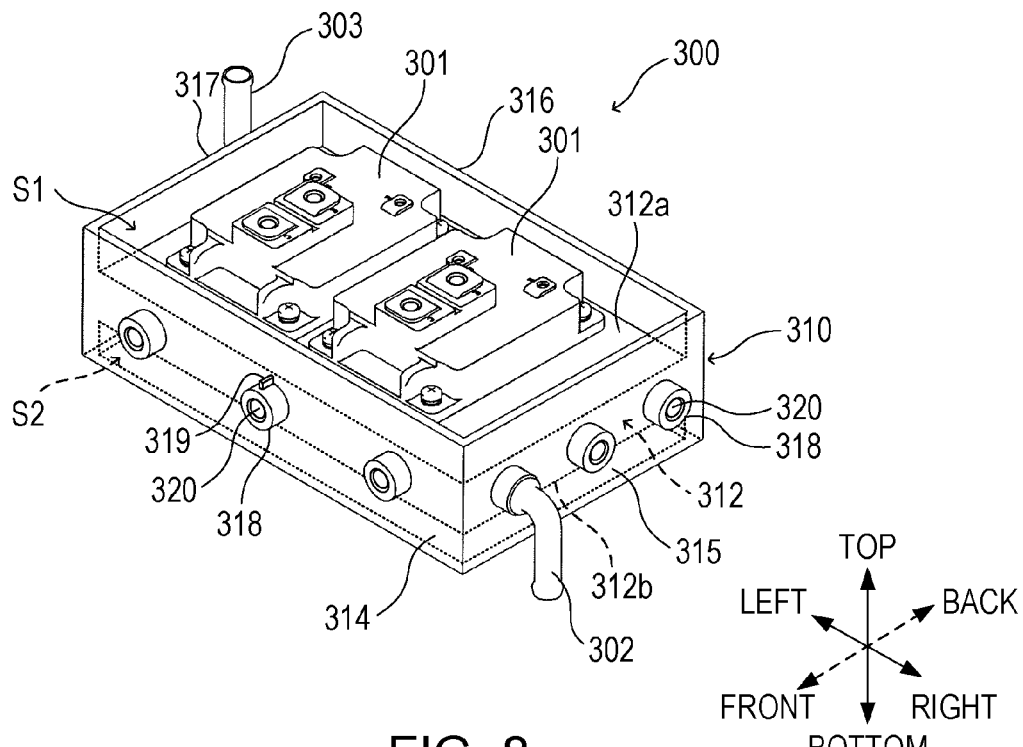
FIG. 7 is a perspective view of an overall structure of a third power converting device having a cooling-medium supply opening and a cooling-medium discharge opening at a right side and a left side thereof.

Next, an overall structure of a third power converting device 300 will be described using FIGS. 7 and 8. Directions in FIGS. 7 and 8 are the same as those in, for example, FIGS. 1 and 2, respectively.

The third power converting device 300 is one in which a cooling-medium supply opening and a cooling-medium discharge opening are disposed at the right side and the left side of the device 300. As shown in FIGS. 7 and 8, the third power converting device 300 includes a housing 310. The housing 310 differs from the housings 110 and 210 in the position of an opening portion 318 corresponding to a supply opening, the position of an opening portion 318 corresponding to a discharge opening, and the shape of a flow path 311. That is, in the third power converting device 300, among a plurality of opening portions 318, the opening portion 318 provided at the front side of a right side surface 315 corresponds to the cooling-medium supply opening to which a supply pipe 302 is connected. The opening portion 318 provided at the back side of a left side surface 317 corresponds to the cooling-medium discharge opening to which a discharge pipe 303 is connected.

Since the forward direction, the backward direction, the leftward direction, the rightward direction, the upward direction, and the downward direction are determined by a protrusion 319 at the opening portion 318 provided at a central portion of a front side surface 314, the opening portions 318 corresponding to the supply opening and the discharge opening are identified from their relative positions from the opening portion 318 where the protrusion 319 is provided, this opening portion serving as a reference position. This point is the same as in the first power converting device 100 and the second power converting device 200.

Figure 8:
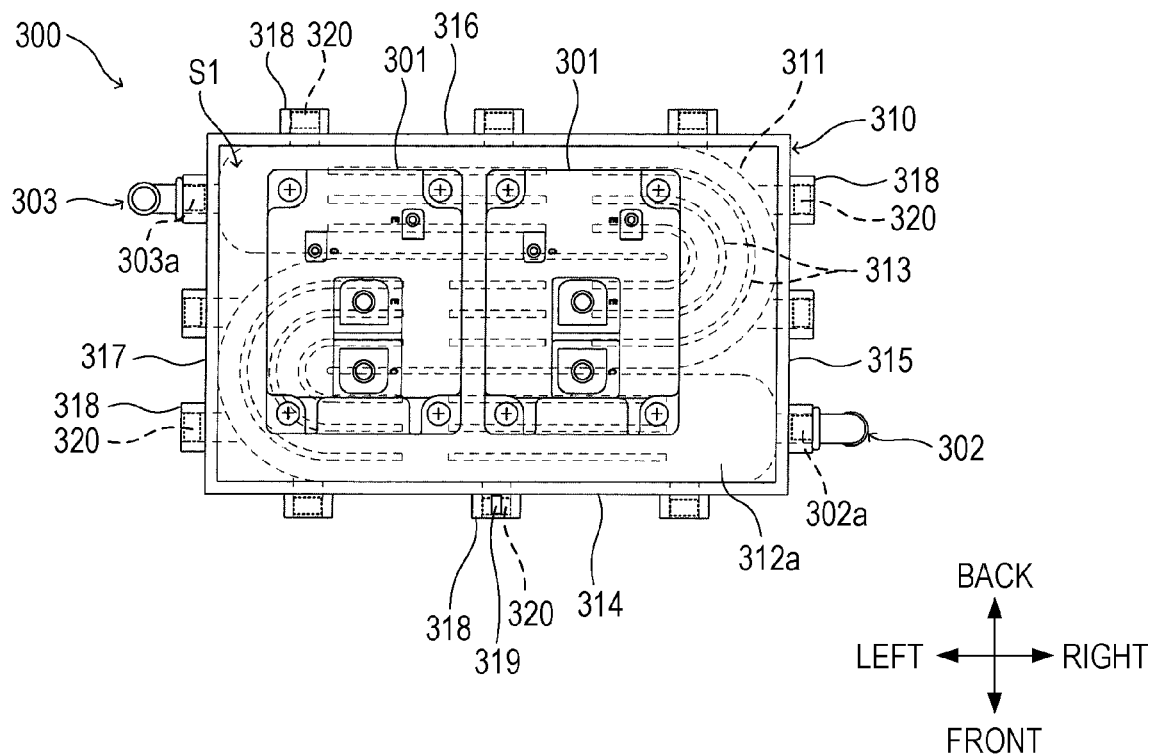
FIG. 8 is a top view of the overall structure of the third power converting device.

As shown in FIG. 8, the flow path 311 is a substantially S-shaped flow path (inverted S-shaped flow path in FIG. 8) in which the opening portions 318 corresponding to the supply opening and the discharge opening are end portions. That is, a cooling medium supplied from the right front supply pipe 302 flows towards the left along the front side in a separation wall 312, turns and flows towards the right along a central portion in a front-back direction, turns again and flows towards the left along the back side of the separation wall 312, and is discharged from the left back discharge pipe 303. In this way, the cooling medium circulates along the entire separation wall 312, so that electronic components including power modules 301 mounted to a top surface 312a and a bottom surface 312b are cooled.

In an inner portion of the flow path 311, a plurality of rectifying plates 313 (three in the embodiment) are provided so as to be substantially parallel to each other along the direction of flow. In the embodiment, the rectifying plates 313 are divided at a plurality of positions (four in the embodiment) in the direction of flow of the cooling medium. The number of divisions and the positions of divisions may be changed. Alternatively, it is possible not to divide the rectifying plates 313. The other structural features are the same as those of the first power converting devices 100 and 200, so that they will not be described.

In the third power converting device 300, in terms of the structure of the flow path 311, considering, for example, cooling efficiency and pressure loss, it is most desirable to dispose the cooling-medium supply opening and the cooling-medium discharge opening as it is shown in FIG. 8. However, the disposition of these openings is not limited thereto. For example, by changing the disposition of the supply opening to the opening portion 318 provided at the right side of the front side surface 314 or by changing the disposition of the discharge opening to the opening portion 318 provided at the left side of the back side surface 316, it is possible to change the dispositions of the supply opening and the discharge opening within a range allowing, for example, a reduction in cooling efficiency and an increase in pressure loss.

In the foregoing description, the top surface 312a and the bottom surface 312b of the separation wall 312 each correspond to an exemplary first surface in the claims. The side surfaces 314 to 317 each correspond to an exemplary second surface. Of the portions of the third power converting device 300, the housing 310, the top surface 312a, the bottom surface 312b, the side surfaces 314 to 317, the opening portions 318, and closing members 320 correspond to an exemplary electronic component cooling unit in the claims.

Next, using FIG. 9, the structure of a master mold 50 and a core 30 used in manufacturing the housing 310 of the third power converting device 300 will be described. A lower left direction in FIG. 9 is defined as "front." An upper right direction in FIG. 9 is defined as "back." An upper left direction in FIG. 9 is defined as "left." A lower right direction in FIG. 9 is defined as "right." An upward direction in FIG. 9 is defined as "top." A downward direction in FIG. 9 is defined as "bottom." These directions correspond to the directions of the power converting device 300 shown in FIGS. 7 and 8.

The master mold 50 corresponds to that used in manufacturing the housing 110 of the first power converting device 100 and the housing 210 of the second power converting device 200, so that the master mold 50 will not be described below. The core 30 has a substantially S shape formed in correspondence with the flow path 311. Three cylindrical holding portions 31 each are provided at a front side, a back side, a left side, and a right side of the core 30 so as to protrude therefrom. By fitting the holding portions 31 to supporting recesses 56 of master mold portions 50A and 50B, the core 30 is held, thereby not allowing positional displacement of the core 30 during press-fitting of molten metal. Grooves 32 for forming the rectifying plates 313 are formed in the core 30. The shapes of the grooves 32 are changed as appropriate in accordance with the shapes of the rectifying plates 313 to be formed.

ADVANTAGES OF THE EMBODIMENTS

According to the power converting device 100 described above, since the opening portions 118 are formed at the side surfaces 114 to 117, it is possible to easily change the disposition of the cooling-medium supply opening and the cooling-medium discharge opening by selecting the opening portions 118 corresponding to the supply opening and the discharge opening, connecting the supply pipe 102 and the discharge pipe 103 to the selected opening portions 118, and providing closing members 120 at the other opening portions 118. Therefore, it is possible to flexibly meet the needs regarding the variously different dispositions of the supply opening and the discharge opening arising from, for example, the use environment and setting conditions of the power converting device 100. The power converting devices 200 and 300 also provide this advantage.

In the embodiments, in particular, by changing only the cores 10, 20, and 30 (the master molds 50 are not changed), it is possible to manufacture the power converting devices 100, 200, and 300 including the cooling-medium flow paths 111, 211, 311 that are optimal for the dispositions of the corresponding supply openings and the corresponding discharge openings. Therefore, compared to a case in which a master mold is changed in accordance with the needs regarding the dispositions of the supply opening and the discharge opening, it is possible to meet the needs without increasing costs and manufacturing time.

In the embodiment, in particular, the housing 110 of the power converting device 100 is integrally formed. Therefore, compared to, for example, a structure in which a plurality of housing members are joined to each other and a flow path is formed at a joint surface of the housing members, this structure provides the following advantages. That is, in the structure in which the plurality of housing members are joined to each other, in order not to allow leakage of water from the joint surface, for example, the housing members are firmly joined to each other by increasing the area of the joint surface or by increasing the number of securing bolts. This makes it difficult to reduce the size and weight of the device. In addition, since, for example, a plurality of securing bolts and sealing members are used, the number of parts, costs, and the number of manhours are increased. In contrast, according to the embodiment, one member is used for the housing 110. Therefore, it is possible not to easily allow leakage of water, and the size and weight of the device can be reduced. In addition, securing bolts, sealing members, etc. are not used, thereby making it possible to reduce the number of parts, costs, and the number of manhours. The power converting devices 200 and 300 also provide the same advantages.

In the embodiment, in particular, the opening portions 118 of the power converting device 100 are provided so as to protrude from the corresponding side surfaces 114 to 117, so that a joining operation of the supply pipe 102 and the discharge pipe 103 to the corresponding opening portions 118 can be enhanced. In addition, in the embodiment, the supply pipe 102 and the discharge pipe 103 are press-fitted and connected to the corresponding opening portions 118. Therefore, by causing the opening portions to have a protruding form, it is possible to ensure press-fit allowance thereof, and to firmly secure the supply pipe 102 and the discharge pipe 103. The power converting devices 200 and 300 also provide the same advantages.

In the embodiment, in particular, a protrusion 119 for identifying the opening portions 118 corresponding to the supply opening and the discharge opening is provided for one of the opening portions 118 of the power converting device 100. By providing the protrusion 119, it is possible to properly connect the supply pipe 102 and the discharge pipe 103 to the corresponding opening portions 118. As a result, it is possible not to allow, for example, an increase in pressure loss and a reduction in cooling efficiency caused by erroneous connections. The power converting devices 200 and 300 also provide the same advantages.

In the embodiment, in particular, three opening portions 118 each are provided at the side surfaces 114 to 117 of the power converting device 100. This makes it possible to dispose the opening portions 118 at three portions, that is, at the central portion, one side, and the other side of each surface. Therefore, it is possible to meet the particular needs regarding the dispositions of the supply opening and the discharge opening. The power converting devices 200 and 300 also provide the same advantages. Modifications The present disclosure is not limited to the above-described embodiments, so that various modifications can be made with a scope not departing from the gist and technical ideas thereof.

For example, although, in the power converting device 100, three opening portions 118 each are provided (that is, a total of twelve opening portions 118 are provided) at the side surfaces 114 to 117, the number of opening portions 118 is not limited thereto. By increasing the number of opening portions 118, it is possible to increase the freedom with which the supply opening and the discharge opening are disposed, thereby making it possible to further meet the particular needs. In contrast, the number of opening portions 118 may be reduced. As long as the total number of opening portions 118 is at least three, the disposition of either one of the supply opening and the discharge opening can be changed to a different opening portion 118. Therefore, it is possible to achieve the principal advantage that the dispositions of the supply opening and the discharge opening can be easily changed. The number of opening portions 118 provided at the side surfaces 114 to 117 may differ from each other. The power converting devices 200 and 300 also provide the same advantages.

For example, although, in the power converting device 100, the opening portions 118 are provided so as to protrude from the corresponding side surfaces 114 to 117, the opening portions 118 may be provided so as not to protrude from the corresponding side surfaces 114 to 117. For example, when the side surfaces 114 to 117 of the housing 110 are thick enough to allow the press-fit allowance of the supply pipe 102 and the discharge pipe 103 to be ensured, it is possible to firmly secure the supply pipe 102 and the discharge pipe 103 even if the opening portions 118 do not have a protruding form. This applies to the power converting devices 200 and 300.

For example, although, in the power converting device 100, the housing 110 is integrally formed by a casting method such as a die casting method, the housing 110 may be formed so as not to be integrally formed. For example, even if the housing 110 has the flow path 111 at a joint surface where a plurality of housing members are joined to each other, when the side surfaces 114 to 117 having the plurality of opening portions 118, it is possible to achieve the principal advantage that the dispositions of the supply opening and the discharge opening can be easily changed. This applies to the power converting devices 200 and 300.

Although, in the foregoing description, the case in which the electronic component cooling unit is applied to the power converting device is described as an example, it is possible to apply the electronic component cooling unit to various other kinds of devices as long as the devices include electronic components that generate heat.

In addition, the methods described in the above-described embodiments and modifications may be combined as appropriate and used. Although not exemplified, various changes may be made to the modifications and embodiments without departing from the scope of the gist thereof.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic component cooling unit comprising:
   a housing having a flow path in an interior thereof, the flow path being configured to circulate a cooling medium;
   at least one first surface provided at the housing, an electronic component being mounted to the at least one first surface;
   a plurality of second surfaces provided at the housing, the plurality of second surfaces surrounding an entire periphery of the at least one first surface, the plurality of second surfaces extending above the at least one first surface;
   a plurality of opening portions provided at the second surface, the plurality of opening portions communicating with the flow path; and
   a closing member configured to close, among the plurality of opening portions, an opening portion other than opening portions corresponding to a supply opening and a discharge opening for the cooling medium.

2. The electronic component cooling unit according to claim 1, wherein the housing is integrally formed.

3. The electronic component cooling unit according to claim 2, wherein the plurality of opening portions protrude from the plurality of second surfaces.

4. The electronic component cooling unit according to claim 3, wherein at least one of the plurality of opening portions includes an identifying portion for identifying the opening portions corresponding to the supply opening and the discharge opening.

5. The electronic component cooling unit according to claim 1,
   wherein at least three opening portions are provided at each of the plurality of second surfaces.

6. The electronic component cooling unit according to claim 1, wherein the plurality of second surfaces extend below the at least one first surface.

7. The electronic component cooling unit according to claim 4, wherein the identifying portion is a protrusion, a recess, or a protruding prismatic shape.

8. The electronic component cooling unit according to claim 1, wherein the closing member is press-fitted to the corresponding opening portion.

9. A power converting device that converts alternating-current power into direct-current power or that converts direct-current power into alternating-current power, the power converting device comprising:
   a housing having a flow path in an interior thereof, the flow path being configured to circulate a cooling medium;
   an electronic component mounted to at least one first surface provided at the housing;
   a plurality of second surfaces provided at the housing, the plurality of second surfaces surrounding a periphery of the at least one first surface and extending above and below the at least one first surface;
   a plurality of opening portions provided at the plurality of second surfaces, the plurality of opening portions communicating with the flow path; and
   a closing member configured to close, among the plurality of opening portions, an opening portion other than opening portions corresponding to a supply opening and a discharge opening for the cooling medium.

10. The power converting device according to claim 9, wherein the housing is integrally formed.

11. The power converting device according to claim 10, wherein the plurality of opening portions protrude from the plurality of second surfaces.

12. The power converting device according to claim 11, wherein at least one of the plurality of opening portions includes an identifying portion for identifying the opening portions corresponding to the supply opening and the discharge opening.

13. The electronic component cooling unit according to claim 12,
   wherein at least three opening portions are provided at each of the plurality of second surfaces.

14. The power converting device according to claim 9, wherein the plurality of second surfaces extend below the at least one first surface.

15. The power converting device according to claim 12, wherein the identifying portion is a protrusion, a recess, or a protruding prismatic shape.

16. The power converting device according to claim 9, wherein the closing member is press-fitted to the corresponding opening portion.

* * * * *